United States Patent [19]

Napoli et al.

[11] 3,716,429

[45] Feb. 13, 1973

[54] METHOD OF MAKING SEMICONDUCTOR DEVICES

[75] Inventors: Louis Sebastian Napoli, Hamilton Square; John Joseph Hughes, Spotswood, both of N.J.

[73] Assignee: RCA Corp.

[22] Filed: June 18, 1970

[21] Appl. No.: 47,425

[52] U.S. Cl. ..........................156/17, 29/579, 29/580

[51] Int. Cl. ..................................................H01l 7/00

[58] Field of Search ....29/578, 580, 583, 579; 317/8, 317/8.1; 156/17, 3

[56] References Cited

UNITED STATES PATENTS

| | | | |
|---|---|---|---|
| 3,427,708 | 2/1969 | Schutze et al. | 29/580 |
| 3,288,662 | 11/1966 | Weisberg | 29/580 |
| 2,944,321 | 7/1960 | Westberg | 29/578 |
| 3,005,132 | 10/1961 | Pankove | 29/580 |

*Primary Examiner*—Charles W. Lanham
*Assistant Examiner*—W. Tupman
*Attorney*—Glenn H. Bruestle

[57] ABSTRACT

Semiconductor devices having thin bodies of a semiconductor material are made from a wafer of the semiconductor material which is thicker than the bodies of the devices. The thicker wafer is provided with spaced thinner portions of the desired area and thickness of the bodies of the devices to be formed by etching recesses in one surface of the wafer. The recesses are formed with flat bottoms which are of the desired area of the bodies of the devices. A masking layer is coated on the bottom of each of the recesses. The active region of each of the devices is formed at the other surface of the wafer over each of the recesses. The semiconductor material between the thin portions of the wafer is then removed by etching the wafer from the one surface of the wafer so as to separate the thin portions of the wafer to form the individual devices. During the last etching process the masking layers on the bottom of the recess protect the thin portions of the wafer from being etched.

9 Claims, 7 Drawing Figures

INVENTORS
Louis S. Napoli &
John J. Hughes
BY Donald S. Cohen
ATTORNEY

METHOD OF MAKING SEMICONDUCTOR DEVICES

BACKGROUND OF THE INVENTION

The present invention relates to a method of making semiconductor devices and more particularly to a method of making semiconductor devices having extremely thin bodies of semiconductor material.

For certain types of semiconductor devices it is desirable to form the device in or on a body of semiconductor material which is extremely thin. Such semiconductor devices include integrated circuits, devices which operate at high frequencies and devices which operate at high powers and require the removal of heat. To form the semiconductor devices on a wafer of the semiconductor material which is of this desired thickness is extremely difficult since the thin wafers are brittle and therefore subject to be easily broken during handling. One method which has been used to try to overcome this problem has been to form the devices in a thick wafer which is then thinned down either by lapping or etching. However, after the wafer is thinned, further operations are often required, such as dicing the wafer into the individual devices, so that the problem of handling the thin wafers still exists. Another method which has been used in an attempt to overcome the problems of handling thin wafers has been to bond the thin wafer to a thick handle substrate which supports the thin wafer during the forming of the devices in the wafer. After the devices are formed, the handle substrate is removed. However, the bond between the wafer and the handle substrate can restrict the type of processing used to form the devices in the wafer. For example, the bond may not be capable of withstanding high temperature operations or etchants or other chemicals used to form the devices. Therefore, it is desirable to have a method for making semiconductor devices having thin bodies of semiconductor material which does not restrict the type of processing used to form the devices and which provides support for the thin bodies until the devices are fully completed.

SUMMARY OF THE INVENTION

A recess is formed in a semiconductor wafer to provide a thin portion thereof. The thin portion is processed to produce a semiconductor device at one surface thereof. The remaining thicker portion of the wafer is then removed leaving the thin-bodied semiconductor device. The semiconductor device may be formed in the thin portion either before or after the recess is formed and preferably at the wafer surface opposite the wafer surface through which the recess is provided.

DETAILED DESCRIPTION

Figure 1:
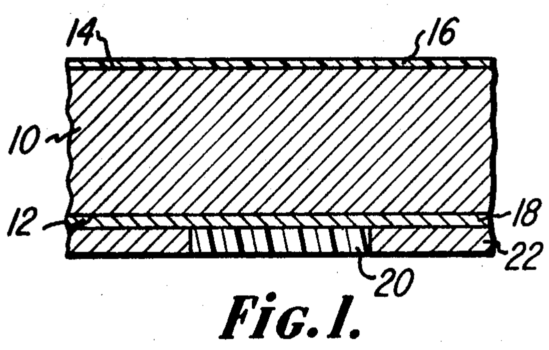
FIGS. 1 through 7 are sectional views illustrating the various steps of the method of the present invention.

For the method of the present invention, one starts with a wafer 10 of a semiconductor material, such as silicon, germanium, or a group III–V semiconductor compound, having a pair of opposed surfaces 12 and 14. The wafer 10 is of a thickness such that it can be easily handled without fear of breaking the wafer and is considerably thicker than the semiconductor body of the device to be formed. Although the forming of only one semiconductor device will be described, a plurality of spaced devices can be simultaneously formed in the wafer 10. As shown in FIG. 1, one surface 14 of the wafer 10 is coated with a masking layer 16 of a resist material which will not be attacked by the various etchants used. However, instead of using a masking layer 16, the wafer 10 can be mounted on a supporting plate of a material which will not be attacked by the etchants so that the surface 14 of the wafer is protected and the other surface 12 is exposed.

As shown in FIG. 1, the surface 12 of the wafer 10 is then coated with a thin film 18 of an electrically conductive metal, such as by evaporation in a vacuum or by electroless plating. A relatively thick layer 20 of a resist material is then coated on a prescribed area of the metal film 18 using standard photolithographic techniques. The resist layer 20 is of a size and shape corresponding to the size and shape of the body of the semiconductor device to be formed. The uncoated area of the metal film 18 is then coated with a relatively thick layer 22 of a metal. The layer 22 can be of any metal which will not be attacked by an etchant for the material of the wafer 10. The metal layer 22 is preferably formed by electroplating since this technique will easily form a thick layer within a reasonable time. The metal film 18 is applied to the wafer 10 to provide an electrically conductive surface on which the metal layer 22 can be plated. However, if the wafer 10 is of a semiconductor material which is sufficiently conductive, the metal film 18 can be eliminated.

Figure 2:
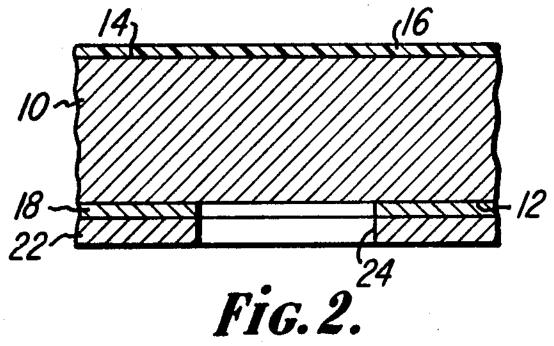

As shown in FIG. 2, the resist layer 20 is then removed using a suitable solvent so as to expose the portion of the metal film 18 thereunder and provide an opening 24 in the metal layer 22. The exposed portion of the metal film 18 is then removed using a suitable etchant. Although the etchant for removing the exposed portion of the metal film 18 may also attack the metal layer 20, since the metal film 18 is much thinner than the metal layer 20, the metal film 18 will be completely etched away before any appreciable amount of the metal layer 20 is also etched away. The removal of the metal film 18 exposes a portion of the surface 12 of the wafer 10 and extends the opening 24 to the surface 12. Of course, if it was not necessary to include the metal film 18 to form the metal layer 22, the removal of the resist layer 20 will expose the portion of the surface 12 of the wafer 10.

Figure 3:
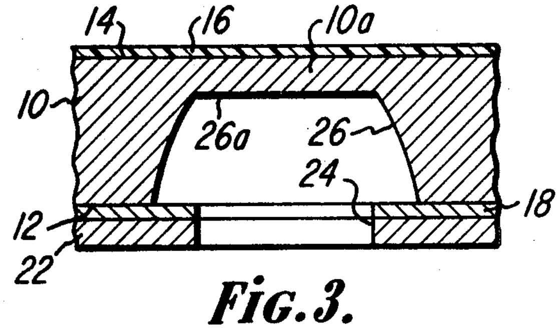

As shown in FIG. 3, a recess 26 is then formed in the surface 12 of the wafer 10 through the opening 24 in the metal layer 22. The recess 26 is formed by contacting the exposed portion of the wafer with an etchant suitable for the particular material of the wafer 10. The recess 26 if formed to a depth such that the thin portion 10a of the wafer 10 between the bottom of the recess and the wafer surface 14 is of the desired thickness for the body of the device being formed. In forming the recess 26, the wafer 10 is not only etched perpendicularly to the surface 12 but also slightly laterally along the surface 12. Thus, as shown in FIG. 3, some of the material of the wafer 10 is removed from under a portion of the metal layer 22 adjacent the edge of the opening 24. Since the metal layer 22 is relatively thick, it is self supporting so that the portion of the metal layer 22 adjacent the edge of the opening 24 projects over the edge of the recess 26 in cantilever fashion. The finished recess 26 has a substantially flat bottom surface 26a which is of the same shape as the opening 24 in the metal layer 22 and is of an area at least as large as the area of the opening 24.

Figure 4:
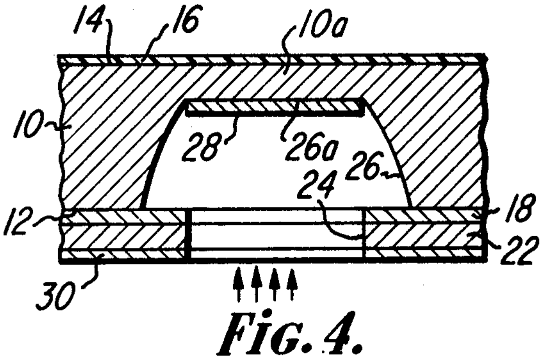

As shown in FIG. 4, a thin layer 28 of a metal is then coated on the bottom surface 26a of the recess 26. The layer 28 is of a metal which will not be attacked by the etchant for material of the wafer 10. Also, if the metal layer 28 is to form part of the device being formed, as will be described, it should be of a metal suitable for its particular purpose. The metal layer 28 is formed by the well known technique of evaporation in a vacuum wherein the wafer 10 and a source of the metal for the layer 28 are placed in a sealed chamber which is evacuated. The source of the metal is heated to evaporate the metal. The metal vapors which contact the bottom surface 26a condense thereon to form the layer 28. For this operation, the soruce of the metal is positioned with respect to the wafer 10 so that the metal vapors pass through the opening 24 in the metal layer 22 perpendicularly to the metal layer 22 as indicated by the arrows in FIG. 4. Thus, the metal vapors will contact only the area of the bottom surface 26a outlined by the opening 24 and the overhanging edge portion of the metal layer 22 shadow masks the side wall of the recess 26 and any portion of the bottom surface 26a which is directly over the overhanging edge portion of the metal layer 22. This provides a metal layer 28 which is of the same size and shape as the opening 24 so that it is of the same size and shape as the desired body of the device being formed. However, the remaining portion of the wall of the recess 26 is uncoated. During the forming of the metal layer 28 on the bottom surface 26*a* of the recess 26 a thin layer 30 of the same metal will be coated on the metal layer 22.

The masking layer 16 is then removed with a suitable solvent, or, if the wafer 10 was mounted on a masking support, it is removed from the support so as to expose the surface 14 of the wafer. The active region of the device being formed is then formed at the surface 14 along the thin portion 10a of the wafer over the metal layer 28. By forming the active region of the device "at" the surface of the wafer it is meant that the active region is formed either in the wafer along the surface or on the surface of the wafer. For example, the active region can be formed by diffusing into the wafer 10 through the surface 14 conductivity modifying impurities to form regions of selected conductivity so as to provide PN junctions. A double diffused planar bipolar transistor comprises a device which can be formed in this manner. Also, the active region can be formed by depositing on the surface 14 thin or thick films of a metal or semiconductor material. A schottky surface barrier type diode can be formed by depositing a metal film on the surface 14. A PN junction type diode can be formed by epitaxially depositing on the surface 14 a film of a semiconductor material of a conductivity type opposite to that of wafer 10. Thus, any desired type of semiconductor device can be formed at the surface 14 of the wafer along thin portion 10*a*, such as a diode, transistor, integrated circuit or the like, using any of the well known techniques for forming the active portion of the device. For illustrative purposes, a Schottky surface barrier type diode will be described.

Figure 5:
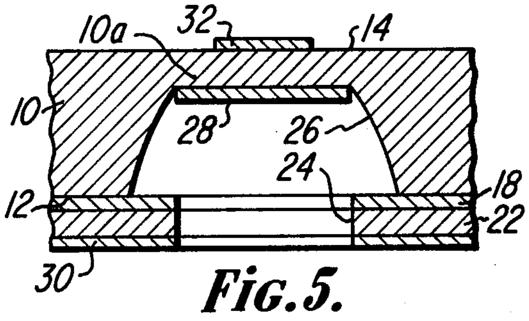

As shown in FIG. 5, the diode is formed by providing on the surface 14 a small, defined area layer 32 of a metal which will form a Schottky surface barrier junction with the particular semiconductor material of the wafer 10. The layer 32 can be formed by providing over the surface 14 a mask having openings where the layer 32 is to be formed and depositing the layer 32 on the exposed portions of the surface 14 by evaporation in a vacuum. Alternatively, the layer 32 can be formed by depositing by evaporation in a vacuum the metal of the layer 32 over the entire area of the surface 14 and then removing the undesired portions of the metal.

Figure 6:
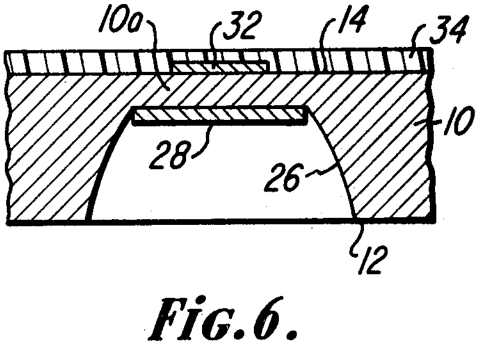
Figure 7:
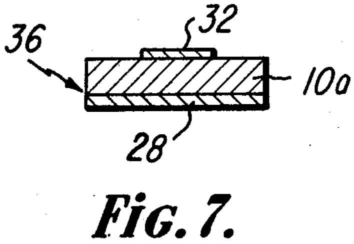

As shown in FIG. 6, a masking layer 34 of a resist material is then coated over the surface 14 of the wafer 10 and the metal layer 32. However, the wafer 10 can be remounted on a masking supporting plate so as to protect the surface 14 and the metal layer 32. The metal layers 30 and 22 and the metal film 18 are then removed, such as by lapping, to expose the surface 12 of the wafer 10. The wafer 10 is then contacted with an etchant suitable for the particular semiconductor material of the wafer. The etchant removes all of the wafer 10 except the thin portion 10a which is coated with the metal layer 28. Thus, the metal layer 28 acts as a mask to protect the thin portion 10a of the wafer 10 during the etching away of the remaining thick portions of the wafer. When the etching of the wafer 10 is completed, the remaining portion is the semiconductor device 36 as shown in FIG. 7. The semiconductor device 36 thus formed comprises the thinned 10*a* of the wafer 10 as the body of the device, the metal film 32 on a surface of the body forming a Schottky surface barrier type junction with the body, and the metal film 28 on the other surface of the body. The metal film 28 provides the other contact to the device.

Although the method of the present invention has been described with the active region of the semiconductor device being formed at the surface 14 of the wafer 10 after the recess 26 is etched in the wafer and the masking layer 28 is coated on the bottom of the recess, the active region of the semiconductor device may be formed at the surface 14 prior to etching the recess 26. However, if the active region is formed prior to etching the recess 26, the active region must be of a type which will not be adverse affected by any of the subsequent steps of the method of the present invention. Also, although the method of the present invention has been described with the active region of the semiconductor device being formed at the surface 14 of the wafer 10, the active region or an active region of the semiconductor device can be formed at the bottom surface 26*a* of the recess 26. For example, the metal layer 28 may be of a metal which will form a Schottky surface barrier type junction diode at the surface 26*a*. This diode may constitute the entire device formed or may be electrically connected by the thin portion 10a of the wafer to a semiconductor device formed at the surface 14. Also, a conductivity modifying impurity may be diffused into the thin portion 10a through the surface 26*a* prior to coating the surface 26*a* with the metal layer 28 to form a region of a particular conductivity type at the surface 26*a*. This region at the surface 26*a* may form with the thin portion 10*a* the semiconductor device, such as a PN junction diode, or may form along with active regions formed at the surface 14, the semiconductor device, such as a bipolar transistor or a silicon controlled rectifier.

Thus, there is provided a method for forming semiconductor devices having very thin bodies of semiconductor material in which defined portions of a thick wafer of the semiconductor material are reduced in thickness to the desired thickness of the body with the thin portions being retained as part of the thicker wafer. The thick portion of the wafer then supports the thin portions during the further processing of the devices so as to permit ease of handling without fear of breaking the thin portions. After the active regions have been formed in the thin portions of the wafer, the thicker portions can be easily removed to leave the finished devices. In fact, when forming a plurality of the devices in a single wafer, the removal of the thicker portions of the wafer automatically separates the wafer into the individual devices. Thus, this method provides for ease of making semiconductor devices having very thin bodies while minimizing the possibility of damaging or breaking the bodies.

EXAMPLE

Schottky surface barrier type diodes can be formed by the method of the present invention starting with a 4 mil thick wafer 10 of gallium arsenide. The wafer 10 is mounted on a supporting plate with a wax with one surface of the wafer being secured to the plate so as to protect that surface. A one micron thick film 18 of an alloy of gallium and gold is coated on the exposed surface of the wafer by evaporation in a vacuum. A layer of a resist material 0.5 mils thick is coated over the gallium-gold film 18 and is defined by standard photolithographic techniques into spaced circular areas 4 mils in diameter leaving the portions of the gallium-gold film between the circular areas uncovered. A layer 22 of gold 0.5 mils thick is coated on the gallium-gold film by electroplating. The resist areas are removed with solvent to expose the areas of the gallium-gold film thereunder. The exposed areas of the gallium-gold film are removed by etching with aqua regia to expose the areas of the wafer thereunder.

The exposed areas of the surface of the wafer are then contacted with an etchant to form the recesses 26. An etchant which has been used for etching recesses in gallium arsenide comprises a water solution of a mixture of 6 parts nitric acid, 3 parts acetic acid and 1 part hydrofluoric acid with the solution being made up of one part of the acid mixture to one-half part water. It is preferable to include in the etchant a small quantity of a wetting agent, such as an alkyl phenoxy polyethoxy ethenol, to obtain the deep etching necessary to form the recesses and to provide a flat bottom surface. One technique which has been used to etch the recesses is to contact the wafer with the etchant for 30 seconds and then wash with water for 30 seconds. After seven cycles of this etching procedure recesses 3 mils deep were formed leaving a 1 mil thick portion of the wafer at the bottom of the recesses. During the etching of the recesses the material of the wafer was etched away from over a portion of the gold layer around the openings in the gold layer so that such portions of the gold layer extends over the completed recesses.

A layer of an alloy of gallium and gold is then coated on the bottom surface of each recess by evaporation in a vacuum. In this operation the evaporation source of the gallium-gold is positioned so that the portion of the gold layer on the wafer which extend over the recess shadow masks the side walls of the recess. Thus the gallium-gold layer is deposited on the bottom surface of each recess over an area directly opposed to the opening in the gold layer. The gallium-gold layer on the bottom surface of each recess is to provide a contact for the diode being formed. Therefore, the wafer is then heated at 570°C for 5 to 10 minutes to form an ohmic contact between the gallium-gold layer and the wafer.

The wafer is then removed form the supporting plate to expose the previously protected surface and a Schottky surface barrier junction is formed on the portion of the exposed surface opposite each of the recesses. The junctions can be formed by coating the surface of the wafer with a layer of a metal which will provide the surface barrier junction, such as nickel or an alloy of gallium and gold. A masking layer of a resist is then provided over the portions of the metal layer which are to provide the junctions using standard photolithographic techniques. The uncovered area of the metal layers are then removed with a suitable etchant leaving a small area of the metal layers on the wafer over each of the recesses.

The wafer is then remounted on a masking support so as to protect the metal areas forming the surface barrier junctions. The gold layer and the underlying gallium-gold film are then removed by lapping. The exposed surface of the wafer is then contacted with an etchant, such as the etchant previously described but without the wetting agent. The wafer is etched for a period of time so as to remove enough of the wafer, not covered by the gallium-gold layers which were coated on the bottoms of the recesses so as to separate the thin portions of the wafer. When this etching is completed there is left on the support the individual Schottky surface barrier diodes. Each of the diodes comprises a body of gallium arsenide 4 mils in diameter and 1 mil thick, a metal film on one surface of the body forming a surface barrier junction with the body and a gallium-gold metal film on the other surface of the body in ohmic contact with the body.

The above specific example is merely to illustrate one type of semiconductor device which can be made by the method of the present invention; many other types of semiconductor devices can be similarly made using techniques known in the art to form the active regions of the device. Also, the wafer can be of any desired semconductive material and the etchants and metal films used will depend on the particular semiconductor material used.

We claim:

1. A method of making a semiconductor device which includes a thin body of a semiconductor material having an active region at a surface thereof comprising the steps of a. providing a wafer of the semiconductor which has a pair of opposed surfaces and which is larger than the body of the device to be formed, b. coating one surface of the wafer with a film of a metal which is not attacked by an etchant for the semiconductor material of the wafer, c. providing an opening in the metal film to expose a portion of the one surface of the wafer of an area corresponding to the desired area of the body of the device, d. contacting the exposed portion of the one surface of the wafer with an etchant to form a recess in said surface with the bottom surface of the recess being of an area at least as large as the desired area of the body of the device and the side wall of the recess being spaced from the edge of the opening in the metal film so that a portion of the metal film around the edge of the opening extends over and overhangs in cantilever fashion the recess, e. passing vapors of a masking material into the recess through the opening in the metal film with the overhanging portion of the metal film shadow masking the side wall of the recess and condensing the vapors on the bottom surface of the recess to coat the bottom surface of the recess with a masking layer, f. forming the active region of the semiconductor device at a surface of the wafer in the region of the wafer coated by the masking layer, and then g. removing the material of the wafer not coated by the masking layer so as to leave the portion of the wafer coated with the masking layer and the active region.

2. A method according to claim 1 wherein said recess is formed prior to the active region of the semiconductor device being formed.

3. A method according to claim 1 wherein said active region of the semiconductor device is formed prior to said recess being formed in said wafer.

4. The method according to claim 1 wherein said active region of the semiconductor device is formed at a surface thereof opposite to the surface in which said recess is formed.

5. The method according to claim 1 wherein said active region of the semiconductor device is formed at the bottom surface of said recess.

6. The method of claim 1 in which the masking layer is of a material which is not attacked by an etchant for the material of the wafer and the material of the wafer not coated by the masking layer is removed by contacting the one surface of the wafer with an etchant.

7. The method of claim 6 in which the metal layer is removed prior to etching away the material of the wafer not coated by the masking layer.

8. The method of claim 7 in which the layer is removed by lapping.

9. The method of claim 8 in which the metal layer is provided with a plurality of spaced openings to exposed separate portions of the one surface of the wafer, a separate recess is formed in each of the exposed portions of the one surface of the wafer, a separate masking layer is coated on the bottom surface of each recess, a separate active region is formed at the other surface of the wafer over each of the recesses, and the material of the wafer coated by the masking layers is removed to provide a plurality of semiconductor devices.

* * * * *